United States Patent
Huang et al.

(10) Patent No.: US 6,787,890 B2
(45) Date of Patent: Sep. 7, 2004

(54) OPTICAL PACKAGE STRUCTURE

(75) Inventors: Nan Tsung Huang, Tu-Chen (TW); Chung Shin Mou, Tu-Chen (TW)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 15 days.

(21) Appl. No.: 10/198,976

(22) Filed: Jul. 18, 2002

(65) Prior Publication Data

US 2003/0222271 A1 Dec. 4, 2003

(30) Foreign Application Priority Data

May 30, 2002 (TW) ........................................ 91207938 U

(51) Int. Cl.[7] .......................... H01L 23/02; H01L 27/15; H01L 33/00
(52) U.S. Cl. .......................... 257/680; 257/80; 257/81; 257/82; 257/98; 257/99
(58) Field of Search ........................... 257/680, 80, 81, 257/82, 98, 99

(56) References Cited

U.S. PATENT DOCUMENTS

| | | | | |
|---|---|---|---|---|
| 4,650,285 A | * | 3/1987 | Stevenson | 250/227.11 |
| 5,703,394 A | * | 12/1997 | Wei et al. | 257/433 |
| 5,932,875 A | * | 8/1999 | Chung et al. | 250/239 |
| 5,950,074 A | * | 9/1999 | Glenn et al. | 438/121 |
| 5,981,945 A | * | 11/1999 | Spaeth et al. | 250/239 |
| 6,130,448 A | * | 10/2000 | Bauer et al. | 257/222 |

* cited by examiner

Primary Examiner—Eddie Lee
Assistant Examiner—Samuel Gebremariam
(74) Attorney, Agent, or Firm—Wei Te Chung

(57) ABSTRACT

An optical package structure (2) includes a cover (21) with a lens part (22), and a base member (23) which combines with the cover to define a closed space in which to package optical components. The base member has a bottom panel (232) and a substrate (234). A plurality of solder pads (231, 237) is provided on a top and bottom surfaces (2321, 2342) of the bottom panel and of the substrate. The solder pads on the top surface electrically connect with the optical components. A plurality of inner conductive traces (236, 238) is provided through the bottom panel and the substrate which electrically connect the solder pads on the top surface of the bottom panel with corresponding solder pads on the bottom surface of the substrate via printed circuits (235) on the substrate. Thus, an external electrical connection of the optical components is attained without wires and electrical pins.

10 Claims, 5 Drawing Sheets

OPTICAL PACKAGE STRUCTURE

FIELD OF THE INVENTION

The present invention generally relates to optical packages, and particularly to optical package structures adapted for high density packaging and high frequency transmission.

BACKGROUND OF THE INVENTION

Optoelectronic components generally require a package structure to protect them from damage and from EMI (Electro Magnetic Interference). Without such protection, damage can result from exposure to moisture, dirt, heat, radiation, or other hazards. In addition, a special structure is desired to electrically connect active components in a package with outer circuitry or other components if the active components need to be electrically connected therewith.

A traditional package structure, shown in FIG. 5, is disclosed in U.S. Pat. No. 5,812,582. The package structure 1 includes a header assembly 17 with a base 10, and a cover assembly 18 having a cover 12 and a lens 13. The two assemblies 17 and 18 are assembled together to define a closed space to receive and protect laser components 16. The laser components 16 are mounted on a surface 101 of the base 10 and a plurality of electrical pins 11 extends through the base 10 via corresponding passages 19 and are electrically isolated from the base 10 by corresponding glass seals 15. The laser components 16 are electrically connected with the corresponding electrical pins 11 by wires 14. Thus, an external electrical connection of the laser components 16 is formed.

The above-mentioned package structure can satisfy a general need for packaging. However, the external electrical connection of the laser components 16 is formed by the electrical pins 11 and wires 14, and the electrical pins 11 and wires 14 are long enough to produce capacitance and inductance strong enough to influence the working character of optical components during high frequency transmission. In addition, in high-density packaging, inner components need more electrical pins and wires to electrically connect with outer components, so packaging volume becomes larger and the short circuits become more frequent.

Therefore, an improved optical package structure that overcomes the above-mentioned disadvantages is desired.

SUMMARY OF THE INVENTION

A main object of the present invention is to provide an optical package structure adapted for high density packaging and high frequency transmission.

To achieve the above object, an optical package structure includes a cover with a lens part, and a base member attachable to the cover, together defining a closed space in which to package optical components. The base member has a bottom panel with the optical components mounted thereon, and a substrate. The bottom panel has a top surface with a plurality of solder pads thereon, and a plurality of inner conductive traces extending therethrough and electrically connecting with the solder pads. The solder pads electrically connect with the optical components. The substrate has a top surface with printed circuits thereon, a bottom surface with a plurality of solder pads thereon, and a plurality of inner conductive traces extending through the substrate and electrically connecting with the printed circuits and the solder pads. When the bottom panel is assembled to the substrate, the conductive traces of the bottom panel electrically connect with the printed circuits, so the solder pads of the bottom panel electrically connect with the solder pads of the substrate. Thus, an external electrical connection of the optical components is attained without wires and electrical pins.

Other objects, advantages and novel features of the invention will become more apparent from the following detailed description of a preferred embodiment thereof when taken in conjunction with the accompanying drawings, wherein:

DETAILED DESCRIPTION OF THE INVENTION

Figure 1:
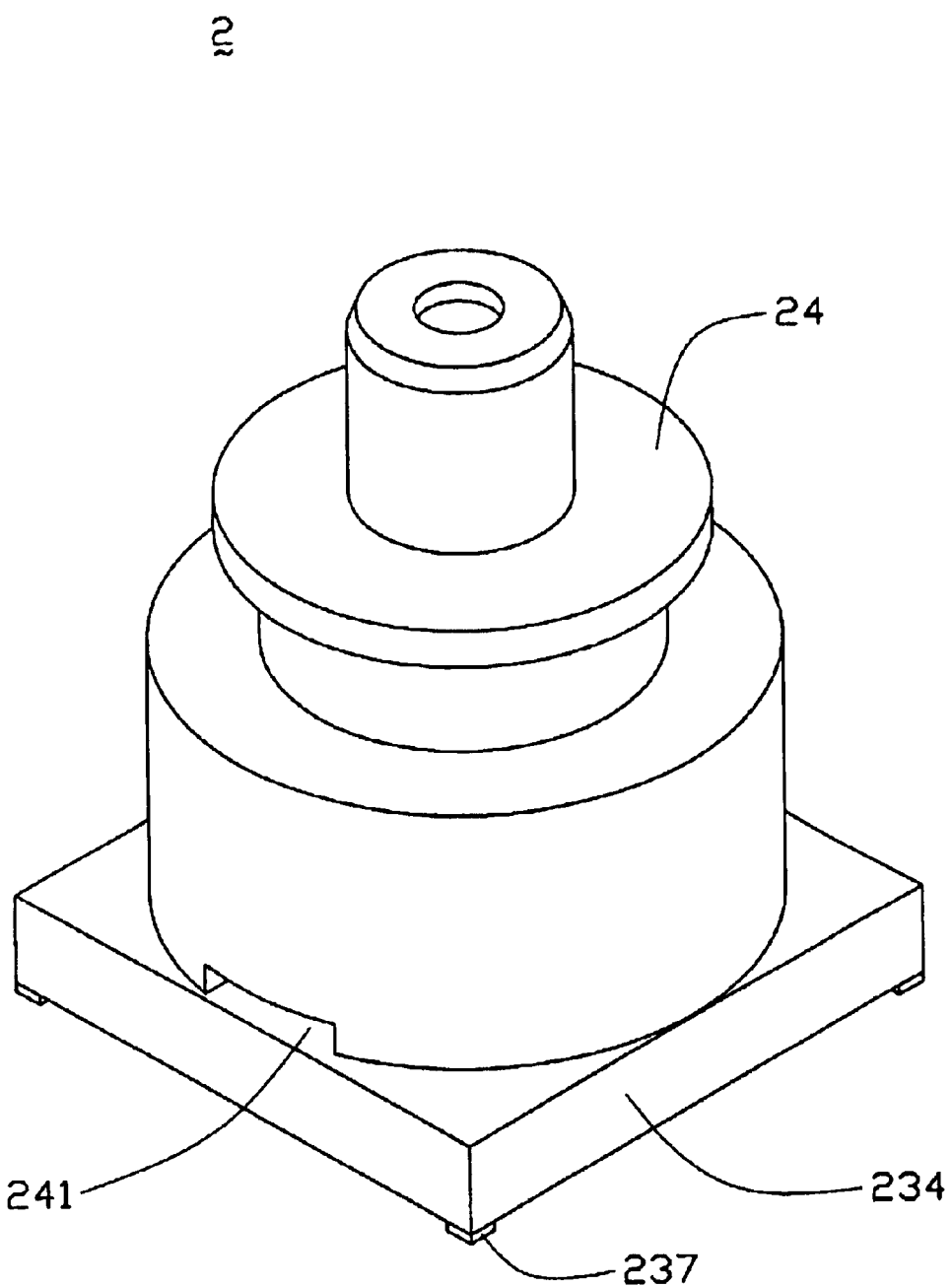
FIG. 1 is a perspective view of an optical package structure of a preferred embodiment of the present invention.
Figure 2:
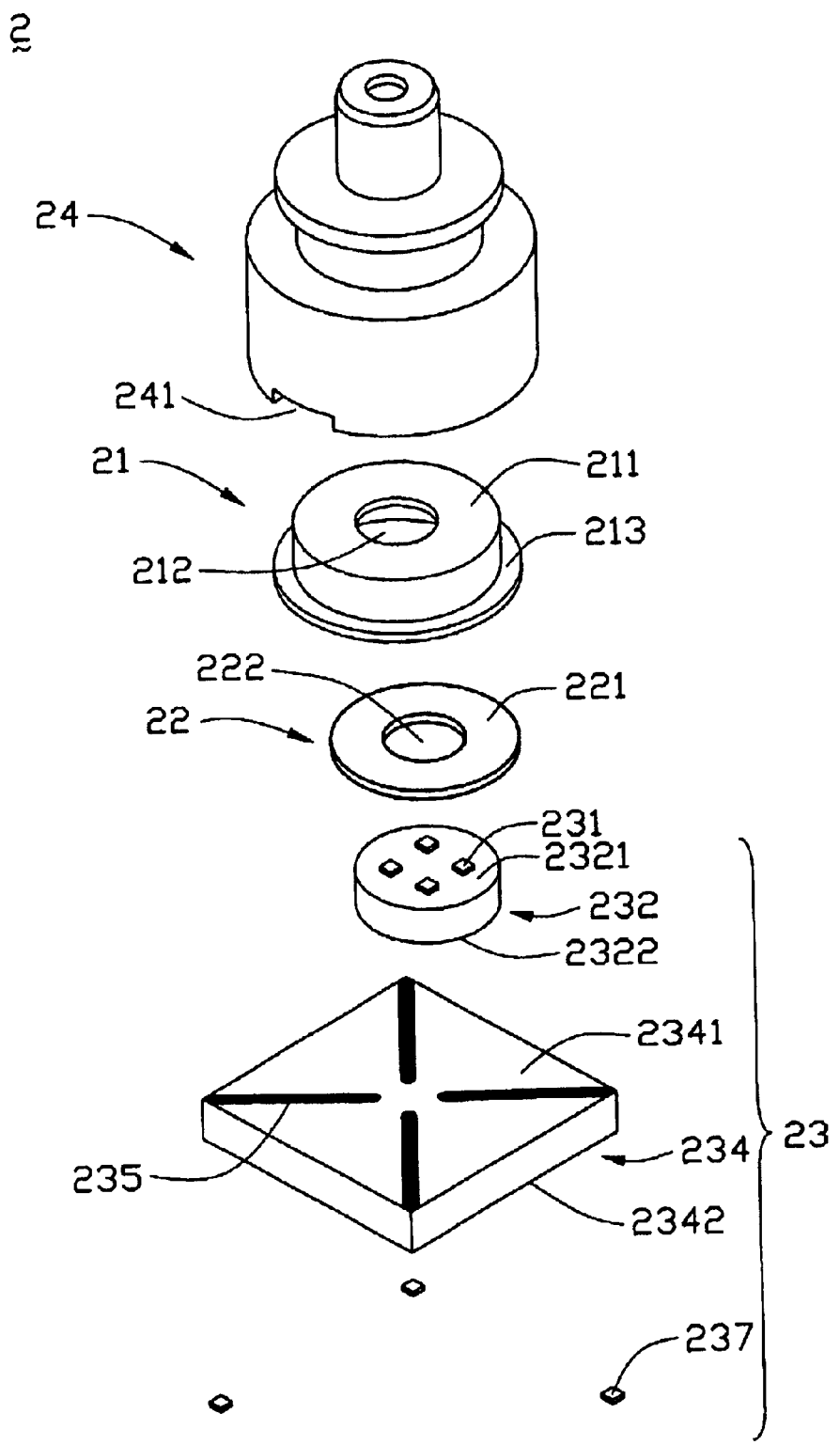
FIG. 2 is an exploded perspective view of the optical package structure of FIG. 2.

Referring now to the drawings in detail, FIGS. 1 and 2 show an optical package structure 2 in accordance with a preferred embodiment of the present invention. The optical package structure 2 comprises a cover 21, a lens part 22 and a base member 23. The lens part 22 is generally secured to the cover 21 and then the cover 21 combines with the base member 23 to define a closed space in which to receive and protect optical components (not shown). The optical package structure 2 further includes an engaging part 24 which surrounds the cover 21 for engaging with an optical fiber or other optical components. The engaging part 24 also has an opening 241 which can make the assembly and disassembly of the engaging part 24 from the cover 21 more easily.

The cover 21 is cap-shaped and is generally made of metal or other conductive materials. The cover 21 has a top panel 211 and a bottom edge 213. The top panel 211 has an aperture 212 in the middle adapted for transmission of optical signals. An upper surface of the bottom edge 213 firmly engages with the engaging part 24 and a lower surface engages with the base member 23. The lens part 22 comprises a lens 222 and a mounting frame 221 to receive the lens 222 therein. When the lens part 22 is secured to the cover 21, the lens 222 optically aligns with the aperture 212 of the cover 21.

Figure 3:
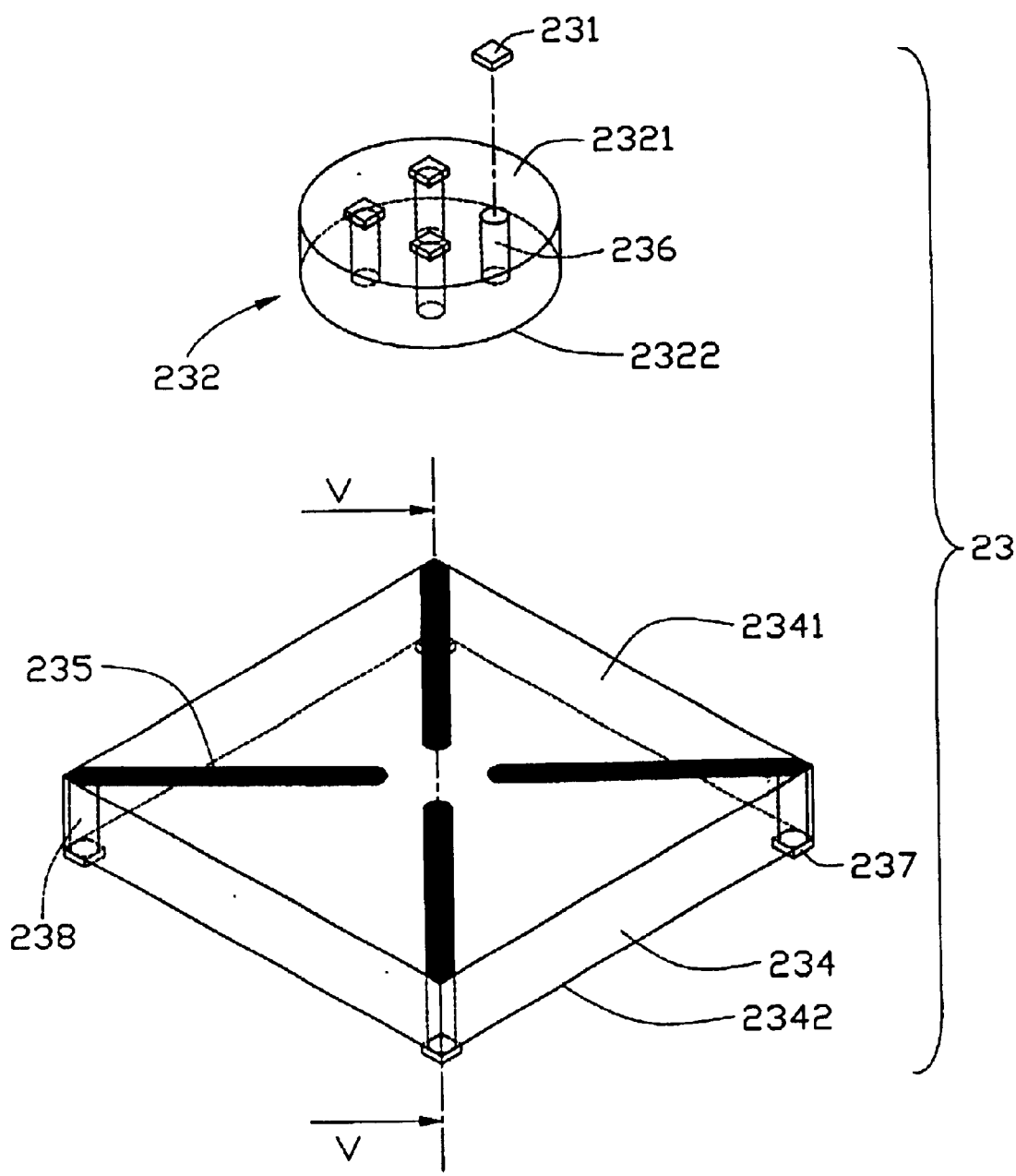
FIG. 3 is a schematic perspective view of a base member of the optical package structure.
Figure 4:
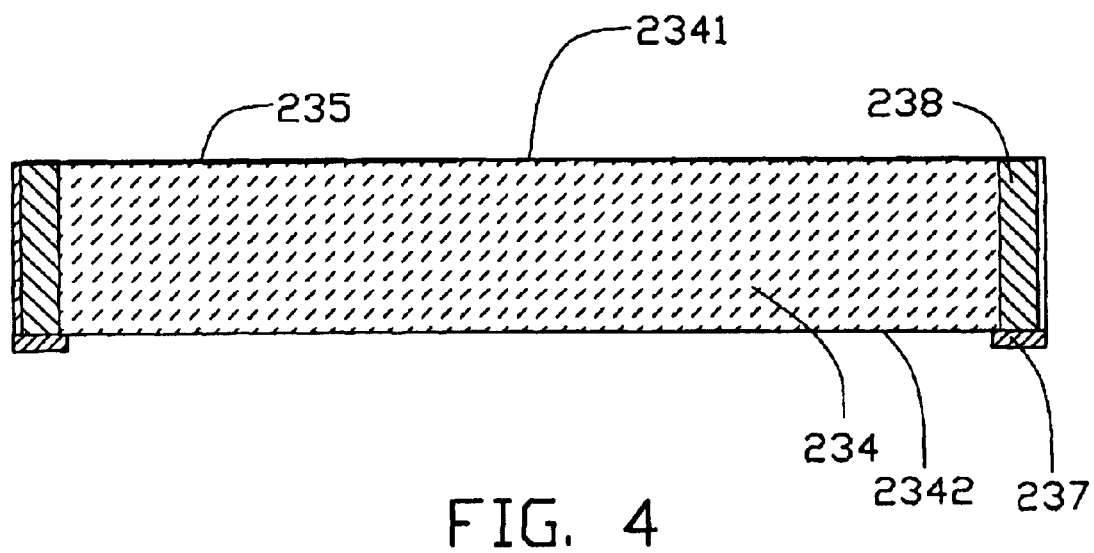
FIG. 4 is a cross-sectional view taken along line V—V of FIG. 4.
Figure 5:
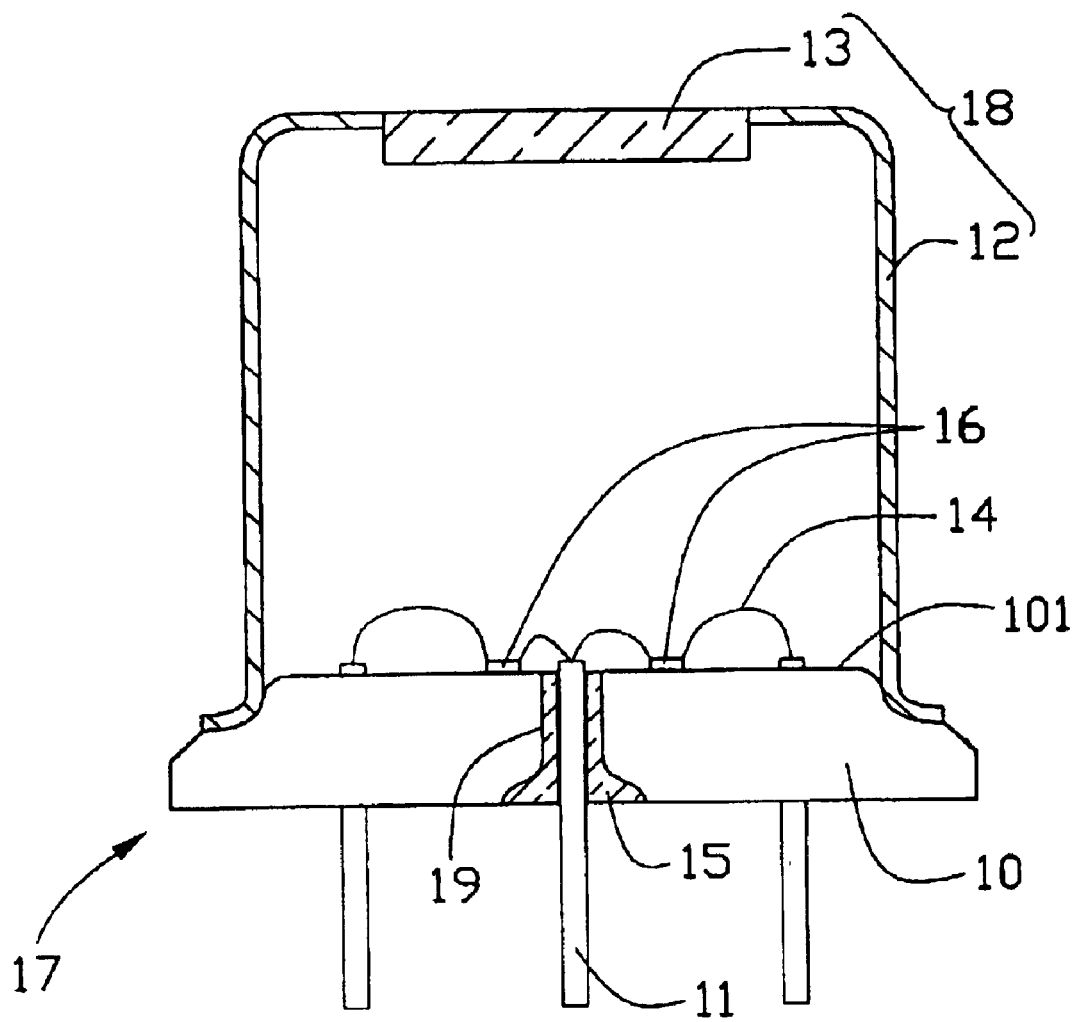
FIG. 5 is a schematic cross-sectional view of an optical package structure of the prior art.

Now referring to FIGS. 3–4 the base member 23 is formed from a kind of ceramic manufactured using Low-Temperature Co-Fired Ceramic (LTCC) technology. In this technology, predetermined circuits or components are formed of a kind of conductive material on a plurality of ceramic sheets, then the ceramic sheets are pressed together and fired at a low temperature to integrally combine them. In the present invention, the conductive material may be copper, aluminum, gold or silver, and the ceramic material may be aluminum nitride.

The base member 23 includes a bottom panel 232 and a substrate 234. The bottom panel 232 has a first surface 2321 for mounting optical components (not shown) thereon, a second surface 2322, and a plurality of inner conductive traces 236 extending through the bottom panel 232. A plurality of solder pads 231 (only 4 solder pads are shown in FIG. 3) is provided on the first surface 2321 to electrically connect with the optical components (not shown) and the conductive traces 236. The substrate 234 has a top surface 2341 with printed circuits 235 thereon, a bottom surface 2342 with a plurality of solder pads 237 thereon and a plurality of inner conductive traces 238 extending though the substrate 234 and electrically connecting with the printed circuits 235 and the solder pads 237. When the bottom panel 232 is assembled to the substrate 234, the second surface 2322 of the bottom panel 232 is coupled to the top surface 2341 of the substrate 234. Correspondingly, the conductive traces 236 electrically connect with the printed circuits 235 respectively, so the solder pads 231 electrically connect with the solder pads 237, respectively.

During assembly of the package structure 2, the optical components are first mounted on the base member 23 and electrically connect to the solder pads 231. The lens part 22 is then secured, to the cover 21 and the cover 21 is fixed to the base member 23, to package the optical components between the cover 21 and base member 23.

Because the solder pads 231 electrically connect with the optical components (not shown), for example, laser emitting devices, and the corresponding solder pads 237, an external electrical connection of the laser emitting devices is thus attained.

Because the optical package structure of the present invention uses inner trace connection through the conductive traces 236, the printed circuits 235, and the conductive traces 238 instead of wire connection, the capacitance and inductance levels associated with the long wires and electrical pins is avoided, which is significant, particularly in high frequency transmissions. In addition, omitting the electrical pins and wires makes packaging volume become smaller and allows higher-density packaging. Furthermore, short circuits are avoided because the electrical pins and wires are eliminated, reducing the possibility of a short circuit.

It is understood that the invention may be embodied in other forms without departing from the spirit thereof. Thus, the present embodiment is to be considered in all respects as illustrative and not restrictive, and the invention is not to be limited to the details given herein.

What is claimed is:

1. An optical package structure comprising:
   a cover with a lens part in a top portion of the cover;
   a base member combining with the cover to define a closed space to package optical components therein; and
   an engaging part surrounding the cover for engaging with an optical fiber or other optical component, and having an opening for making assembly and disassembly of the engaging part to and from the cover easy;
   wherein a plurality of solder pads is provided on both a top and a bottom surface of the base member, and a plurality of inner conductive traces which extends through the base member is provided to electrically connect the solder pads on the top surface to the solder pads on the bottom surface.

2. The optical package structure as claimed in claim 1, wherein a plurality of optical components are fitted in the optical package structure connecting to the corresponding solder pads and a printed circuit board is provided on which the optical package structure is mounted.

3. The optical package structure as claimed in claim 2, wherein the base member includes a bottom panel and a substrate.

4. The optical package structure as claimed in claim 3, wherein the bottom panel has a first surface, a second surface, and a plurality of inner conductive traces extending through the bottom panel, and a plurality of the solder pads is provided on the first surface to electrically connect with the conductive traces.

5. The optical package structure as claimed in claim 4, wherein the substrate has a top surface with printed circuits thereon, a bottom surface with a plurality of the solder pads thereon, and a plurality of inner conductive traces extending through the substrate to electrically connect the printed circuits with the solder or pads.

6. The optical package structure as claimed in claim 5, wherein the substrate combines with the bottom panel so that the conductive traces of the bottom panel electrically connect with respective printed circuits on the substrate.

7. An optical package structure comprising:
   a cover defining an aperture in a top portion for transmission of optical signals;
   a lens part secured to the cover;
   a base member combining with the cover to define a closed space to package optical components therein; and
   an engaging part surrounding the cover for engaging with an optical fiber or other optical component, and having an opening for making assembly and disassembly of the engaging part to and from the cover easy;
   wherein a plurality of solder pads is provided on both a top and a bottom surface of the base member, a plurality of inner conductive traces extends through the base member and provides an electrical connection of the solder pads on the top surface with the solder pads on the bottom surface, a plurality of optical components is fitted in the optical package structure connecting to the corresponding solder pads, and a printed circuit board is provided on which the optical package structure is mounted.

8. The optical package structure as claimed in claim 7, wherein the lens part comprises a lens and a mounting frame to receive the lens therein.

9. The optical package structure as claimed in claim 8, wherein the lens part is secured within the cover with the lens optically focusing through the aperture of the cover.

10. The optical package structure as claimed in claim 7, wherein the base member is formed from a kind of ceramic using Low-Temperature Co-Fired Ceramic technology.

* * * * *